US011334179B2

(12) United States Patent
Li et al.

(10) Patent No.: US 11,334,179 B2
(45) Date of Patent: May 17, 2022

(54) DISPLAY PANEL TO MITIGATE SHORT-CIRCUITING BETWEEN TOUCH ELECTRODES, AND DISPLAY DEVICE

(71) Applicant: Wuhan Tianma Micro-Electronics Co., Ltd., Wuhan (CN)

(72) Inventors: Yuanbo Li, Wuhan (CN); Jiachang Gu, Wuhan (CN); Xianbao Song, Wuhan (CN); Tao Peng, Wuhan (CN); Pei He, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 17/005,831

(22) Filed: Aug. 28, 2020

(65) Prior Publication Data
US 2021/0373691 A1 Dec. 2, 2021

(30) Foreign Application Priority Data
Jun. 2, 2020 (CN) .......................... 202010491527.4

(51) Int. Cl.
*G06F 3/041* (2006.01)
*G06F 3/044* (2006.01)
(Continued)

(52) U.S. Cl.
CPC ........ *G06F 3/0412* (2013.01); *G02F 1/13338* (2013.01); *G06F 3/0446* (2019.05);
(Continued)

(58) Field of Classification Search
CPC ......... G06F 2203/04111; G06F 3/0412; G06F 3/0446
See application file for complete search history.

(56) References Cited

U.S. PATENT DOCUMENTS

2014/0320761 A1* 10/2014 Misaki .................. G06F 3/0443
349/12
2016/0349889 A1* 12/2016 Yang .................... G02F 1/13338
(Continued)

FOREIGN PATENT DOCUMENTS

CN  109213365 A  1/2019
CN  109725765 A  5/2019

*Primary Examiner* — Laurence J Lee
(74) *Attorney, Agent, or Firm* — Alston & Bird LLP (57) ABSTRACT

The present disclosure relates to display technology and, particularly, to a display panel and a display device. In the display panel, a bridging connection layer includes multiple bridge electrodes and a touch electrode layer includes multiple first touch electrodes and multiple second touch electrodes. A first electrode unit of each first touch electrodes includes a first electrode subsection. A vertical projection of the first electrode subsection on a plane where the bridging connection layer is located is within a cover of a bridge electrode. In one embodiment, each bridge electrode includes a bridge electrode terminal and a bridge trace, in a second direction where multiple second electrode units of each second touch electrode are arrange, and extension length of the bridge electrode terminal is greater than a width of the bridge trace, and a first corner is formed at a joint of the bridge electrode terminal and the bridge trace.

20 Claims, 8 Drawing Sheets

(51) Int. Cl.
*G02F 1/1333* (2006.01)
*H01L 27/32* (2006.01)
(52) U.S. Cl.
CPC .. *H01L 27/323* (2013.01); *G06F 2203/04111* (2013.01); *G06F 2203/04112* (2013.01)

(56) References Cited

U.S. PATENT DOCUMENTS

2019/0163314 A1* 5/2019 Kim ................... G06F 3/0412
2020/0033997 A1* 1/2020 Wang .................. G06F 3/0443
2021/0117043 A1* 4/2021 Lee ..................... G06F 3/044

* cited by examiner

DISPLAY PANEL TO MITIGATE SHORT-CIRCUITING BETWEEN TOUCH ELECTRODES, AND DISPLAY DEVICE

CROSS-REFERENCE TO RELATED APPLICATIONS

This application claims priority to Chinese patent application No. CN202010491527.4 filed with CNIPA on Jun. 2, 2020, the disclosure of which is incorporated herein by reference in its entirety.

TECHNICAL FIELD

The embodiments of the present disclosure relate to the field of display technology and, particularly, to a display panel and a display device.

BACKGROUND

With the progress of the information age, touch screen technology has gradually replaced key technology as the mainstream technology of mobile terminals. The touch screen technology detects a position (in the form of coordinates) at which a finger, a pen or the like touches a touch screen mounted on the front side of a display device, sends the detected position to a CPU, and then determines input information. At present, the application range of the touch screen is very broad. The main products include mobile terminals such as touch mobile phones and touch notebook computers, as well as man-machine display interfaces in the industrial automation industry.

In order to realize the touch function of the display device, it is usually required to introduce touch electrodes into the display device, and different touch electrodes are insulated from each other, which require disconnection processing on a touch metal layer. However, in the process of manufacturing the touch metal layer, some residual metal may be generated due to the process. Such residual metal may cause short-circuiting between different touch electrodes, thereby making the touch function inoperative.

SUMMARY

The present disclosure provides a display panel and a display device, so as to avoid short-circuiting between different touch electrodes caused by residual metal, and to ensure normal touch function.

In one aspect, an embodiment of the present disclosure provides a display panel, including a display function layer and a touch function layer.

The touch function layer includes a bridging connection layer, an insulating layer and a touch electrode layer which are disposed in turn on a light extraction side of the display function layer.

The bridging connection layer includes multiple bridge electrodes.

The touch electrode layer includes multiple first touch electrodes and multiple second touch electrodes, the multiple first touch electrodes and the multiple second touch electrodes are insulated from each other; the first touch electrode includes multiple first electrode units electrically connected to each other, the multiple first electrode units are arranged in a first direction; the second touch electrode includes multiple second electrode units electrically connected to each other, the multiple second electrode units are arranged in a second direction; the first direction and the second direction intersect; and in each of the multiple first touch electrodes, any two adjacent first electrode units are electrically connected through the bridge electrode.

The first electrode unit includes a first electrode subsection, and a vertical projection of the first electrode subsection on a plane where the bridging connection layer is located is within coverage of the bridge electrode.

In another aspect, an embodiment of the present disclosure further provides a display device. The display device includes the display panel of the first aspect.

DETAILED DESCRIPTION

Hereinafter the present disclosure will be further described in detail in conjunction with the drawings and embodiments. It is understood that the specific embodiments set forth below are intended to illustrate and not to limit the present disclosure. Additionally, it is noted that, for convenience of description, only part, not all, of the structures related to the present disclosure are illustrated in the drawings.

Figure 1:
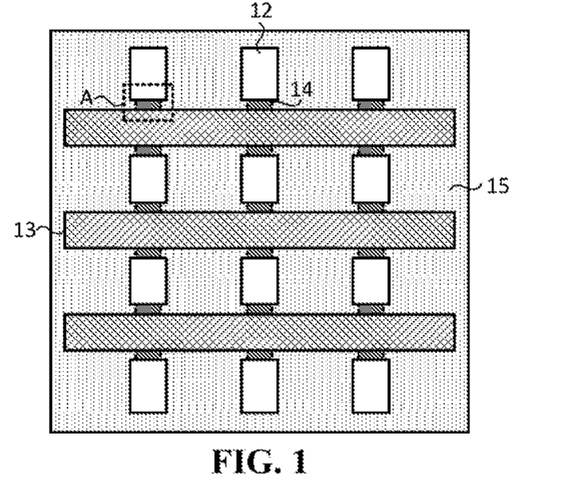
FIG. 1 is a schematic structure diagram of an existing display panel.
Figure 2:
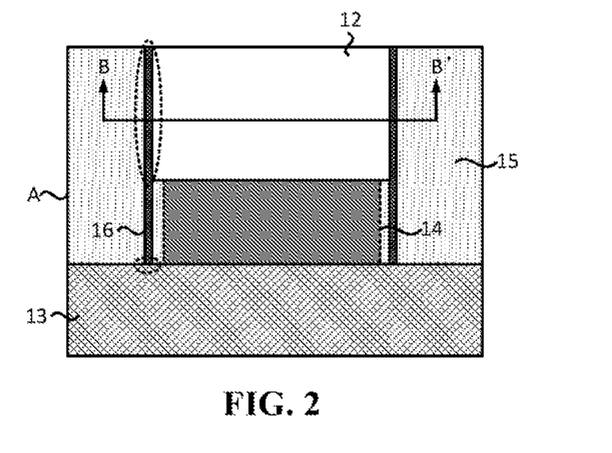
FIG. 2 is a schematic enlarged structure view of FIG. 1 at A.
Figure 3:
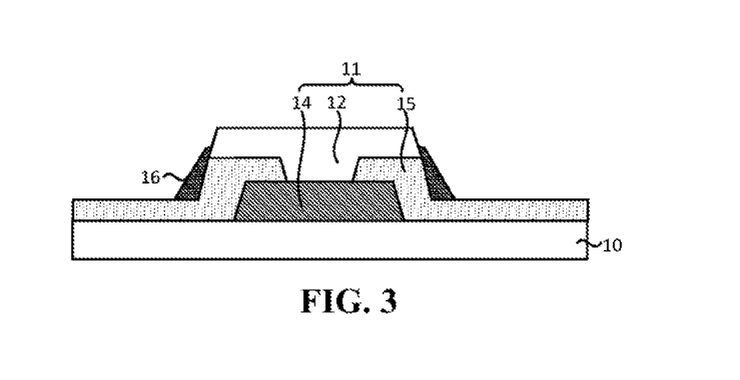
FIG. 3 is a schematic cross-sectional view of FIG. 2 taken along an B-B' direction.

FIG. 1 is a highly simplified schematic diagram of an existing display panel; FIG. 2 is an enlarged view of the area defined by boundary A of FIG. 1; FIG. 3 is a cross-sectional view of FIG. 2 taken along an B-B' direction. Referring to FIGS. 1 to 3 concurrently, the display panel includes a display function layer 10 and a touch function layer 11. The touch function layer 11 includes multiple touch driving electrodes 12, multiple touch sensing electrodes 13, and multiple bridge electrodes 14 for connecting the touch driving electrodes 12 or the touch sensing electrodes 13. The touch driving electrodes 12 and the touch sensing electrodes 13 are disposed in a same metal layer. A metal layer in which the bridge electrodes 14 are disposed is different from that of the touch driving electrodes 12 and the touch sensing electrodes 13. The touch driving electrodes 12 and the touch sensing electrodes 13 are insulated from each other. The display panel generates touch information based on the change of capacitance between the touch driving electrode 12s and the touch sensing electrodes 13 to further realize the touch function.

In order to avoid the display function layer 10 affecting the change of capacitance between the touch driving electrodes 12 and the touch sensing electrodes 13, the bridge electrodes 14 are typically arranged in a metal layer adjacent to the display function layer 10, and the touch driving electrodes 12 and the touch sensing electrodes 13 are arranged in a metal layer at a side of the bridge electrodes 14 facing away from the display function layer 10. Specifically, referring to FIG. 2 and FIG. 3 concurrently, when the touch function layer 11 is manufactured, first, a metal layer is formed on a light extraction side of the display function layer 10. Then a bridge electrode 14 is formed through an etching process. Then an insulating layer 15 is formed on the bridge electrode 14, a metal layer is formed on the insulating layer 15, and a touch driving electrode 12 and a touch sensing electrode 13 are formed through the etching process. When the touch driving electrode 12 and the touch sensing electrode 13 are formed, a small amount of metal remains at the edge of the bridge electrode 14. Such residual metal 16 is electrically connected to the touch driving electrode 12 and the touch sensing electrode 13 separately at the positions circled by ellipses in FIG. 2, thus short-circuiting the touch driving electrode 12 and the touch sensing electrode 13, and rendering the touch function inoperative.

In consideration of the above, embodiments of the present disclosure provide a display panel and a display device, including, in part, a display function layer and a touch function layer. The touch function layer includes a bridging connection layer, an insulating layer and a touch electrode layer which are disposed, in turn, on a light extraction side of the display function layer. The bridging connection layer includes multiple bridge electrodes. The touch electrode layer includes multiple first touch electrodes and multiple second touch electrodes. The multiple first touch electrodes and the multiple second touch electrodes are insulated from each other. The first touch electrode includes multiple first electrode units electrically connected to each other. The multiple first electrode units are arranged in a first direction. The second touch electrode includes multiple second electrode units electrically connected to each other and arranged in a second direction. The first direction and the second direction intersect, and in each of the multiple first touch electrodes, any two adjacent first electrode units are electrically connected through the bridge electrode. The first electrode unit includes a first electrode subsection. A vertical projection of the first electrode subsection on a plane where the bridging connection layer is located is within the coverage of the bridge electrode.

In view of the above, with the setting in which a vertical projection of the first electrode subsection of the first electrode unit in the first touch electrode on a plane where the bridging connection layer is located is within the coverage range of the bridge electrode, a certain gap is caused to form between the first electrode subsection and the residual metal formed at the edge of the bridge electrode, so that the first electrode subsection is insulated from the residual metal. This prevents any short-circuiting between the first touch electrode where the first electrode subsection is located and the second touch electrode that would otherwise occur due to residual metal. Embodiments of the present disclosure therefore ensure effective operation of the touch effect of the display panel.

Embodiments of the present disclosure will be described clearly and completely in conjunction with the drawings in the embodiments of the present disclosure. All other variations and modifications of the embodiments of the present disclosure, fall within the scope of the present disclosure.

Figure 4:
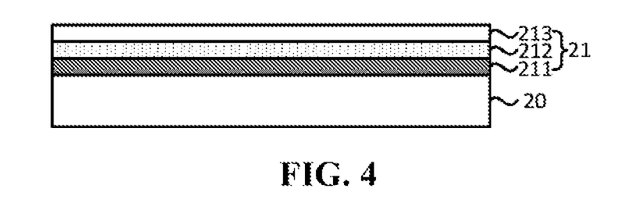
FIG. 4 is a schematic structural diagram of a display panel according to an embodiment of the present disclosure.
Figure 5:
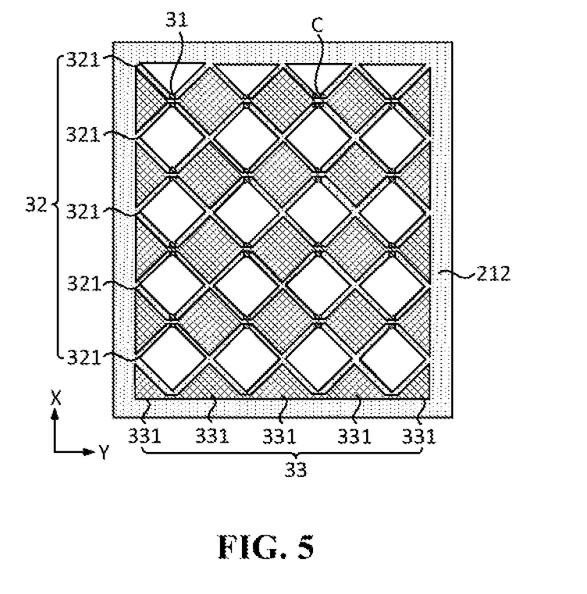
FIG. 5 is a schematic structural diagram of another display panel according to an embodiment of the present disclosure.
Figure 6:
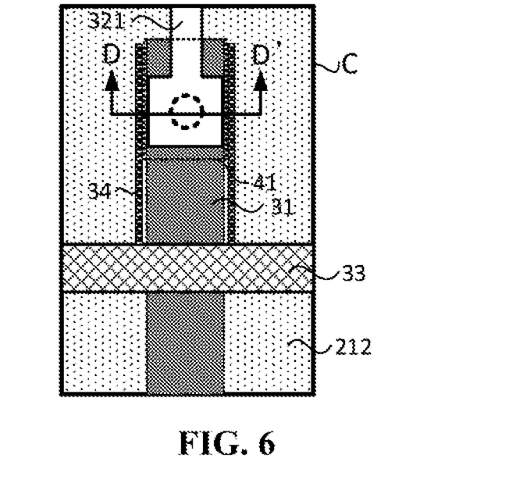
FIG. 6 is a schematic enlarged structure view of FIG. 5 at C.
Figure 7:
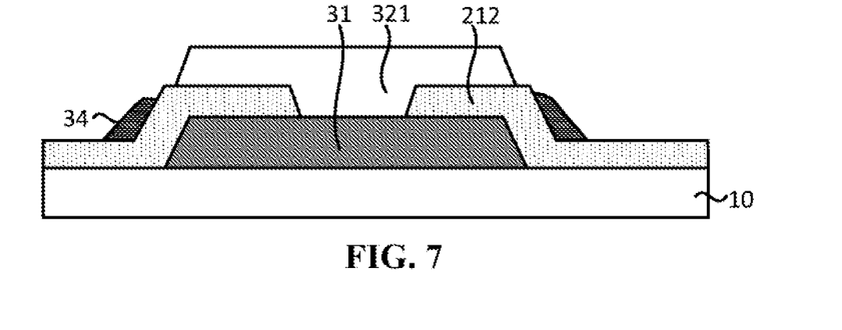
FIG. 7 is a schematic cross-sectional view of FIG. 6 taken along an D-D' direction.

FIG. 4 is a simplified side schematic diagram of a display panel according to an embodiment of the present disclosure. FIG. 5 is a simplified top schematic diagram of a display panel according to another embodiment of the present disclosure. FIG. 6 is an enlarged structure view of FIG. 5 near the region defined by C. FIG. 7 is a cross-sectional schematic view of FIG. 6 taken along D-D' direction. As shown in FIGS. 4 to 7, the display panel provided by embodiments of the present disclosure includes a display function layer 20 and a touch function layer 21. The touch function layer 21 includes a bridging connection layer 211, an insulating layer 212 and a touch electrode layer 213 which are disposed in turn on a light extraction side of the display function layer 20. The bridging connection layer 211 includes multiple bridge electrodes 31. The touch electrode layer 213 includes multiple first touch electrodes 32 and multiple second touch electrodes 33; the multiple first touch electrodes 32 and the multiple second touch electrodes 33 are insulated from each other. The first touch electrode 32 includes multiple first electrode units 321 electrically connected to each other. The multiple first electrode units 321 are arranged in a first direction X. The second touch electrode 33 includes multiple second electrode units 331 electrically connected to each other. The multiple second electrode units 331 are arranged in a second direction Y. The first direction X and the second direction Y intersect, and in each of the multiple first touch electrodes 32, any two adjacent first electrode units 321 are electrically connected through the bridge electrode 31. The first electrode unit 321 includes a first electrode subsection 41. A vertical projection of the first electrode subsection 41 on a plane where the bridging connection layer 211 is located is within the coverage of the bridge electrode 31.

Referring to FIGS. 4 to 7 concurrently, in order to reduce the influence of the display function layer 20 on the first touch electrode 32 and the second touch electrode 33 in the touch function layer 21, and to ensure the touch effect, the bridge electrode 31 is disposed in the bridging connection layer 211 which is closer to the display function layer 20. The first touch electrode 32 and the second touch electrode 33 are disposed in the touch electrode layer 213 which is farther from the display function layer 20. Specifically, in the touch electrode layer 213, multiple first electrode units 321 arranged in the first direction X are electrically connected in turn through the bridge electrode 31 to form a first touch electrode 32, and multiple second electrode units 331 arranged in the second direction Y are electrically connected in turn to form a second touch electrode 33. The first touch electrode 32 and the second touch electrode 33 are insulated from each other. The display panel generates touch information based on a change of capacitance between the first touch electrode 32 and the second touch electrode 33, thereby implementing a touch function.

When the first touch electrode 32 and the second touch electrode 33 are formed, residual metal 34 is formed at the edge of the bridge electrode 31; the residual metal 34, the first touch electrode 32 and the second touch electrode 33 are all located in the touch electrode layer 213. Since the bridge electrode 31 intersects the second touch electrode 33, the residual metal 34 formed at the edge of the bridge electrode 31 is electrically connected to the second touch electrode 33. If the residual metal 34 is electrically connected to the first touch electrode 32, short-circuiting will occur between the first touch electrode 32 and the second touch electrode 33, thereby making the touch function inoperative.

In this embodiment, the first electrode unit 321 includes a first electrode subsection 41. The first electrode subsection 41 is a portion of the first electrode unit 321 for electrically connecting with the bridge electrode 31, as shown in FIGS. 6 and 7. Given the setting in which the vertical projection of the first electrode subsection 41 on the plane where the bridging connecting layer 211 is located is within the coverage of the bridge electrode 31, and the presence of a gap between the first electrode subsection 41 and the residual metal 34 formed at the edge of the bridge electrode 31, the first electrode subsection 41 is thus insulated from the residual metal 34, so as to avoid short-circuiting between the first touch electrode 32 and the second touch electrode 33 where the first electrode subsection 41 is located, and to ensure the proper operation of the touch effect of the display panel.

It should be noted that residual metal may exists at any position of the edge of the bridge electrode 31. The drawings provided in the embodiment of the present disclosure only show key positions where the residual metal 34 will likely cause short-circuiting between the first touch electrode 32 and the second touch electrode 33.

In the display panel provided by the embodiment of the present disclosure, given the setting in which a vertical projection of the first electrode subsection 41 of the first electrode unit 321 in the first touch electrode 32 on a plane where the bridging connection layer 211 is located is within the coverage range of the bridge electrode 31, a gap is caused to exist between the first electrode subsection 41 and the residual metal 34 formed at the edge of the bridge electrode 31, so that the first electrode subsection 41 is insulated from the residual metal 34, and thereby preventing any short-circuiting between the first touch electrode 32 where the first electrode subsection 41 is located and the second touch electrode 33. Accordingly, the touch effect of the display panel is ensured.

Figure 8:
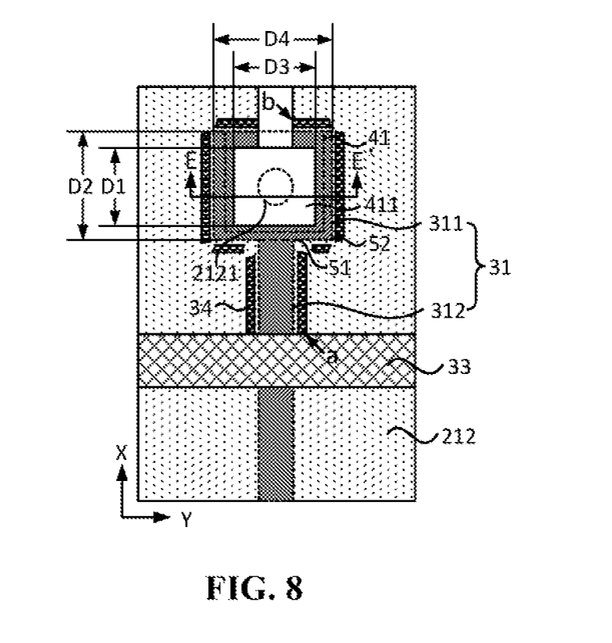
FIG. 8 is a schematic structural diagram of yet another display panel according to an embodiment of the present disclosure.
Figure 9:
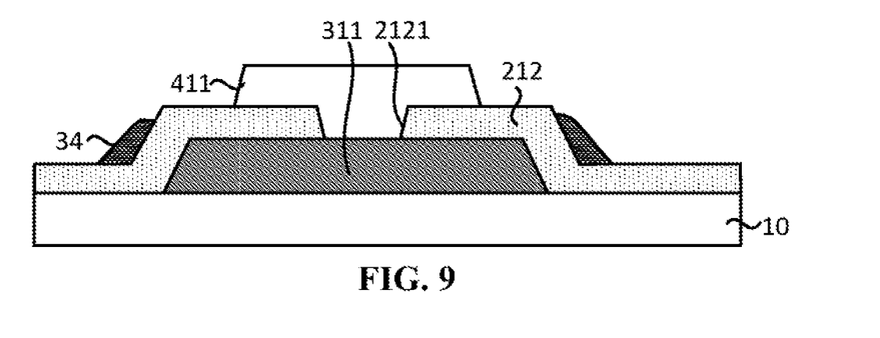
FIG. 9 is a schematic cross-sectional view of FIG. 8 taken along an E-E' direction.

FIG. 8 is a top schematic diagram of a display panel according to another embodiment of the present disclosure; FIG. 9 is a cross-sectional schematic diagram of FIG. 8 along the E-E' direction. As shown in FIGS. 8 and 9, in an embodiment, the bridge electrode 31 includes a bridge electrode terminal 311 and a bridge trace 312 electrically connected to the bridge electrode terminal 311. The first electrode section 41 includes a first electrode terminal 411; the insulating layer 212 is provided with multiple vias 2121; the first electrode terminal 411 is electrically connected to the bridge electrode terminal 311 through a via 2121. A vertical projection of the first electrode terminal 411 on a plane where the bridging connection layer 211 is located is within the coverage of the bridge electrode terminal 311.

Referring to FIGS. 8 and 9, the bridge electrode 31 is provided with a bridge electrode terminal 311; the first electrode subsection 41 is provided with a first electrode terminal 411, and the bridge electrode terminal 311 and the first electrode terminal 411 are electrically connected through the via 2121 in the insulating layer 212. With the setting in which vertical projection of the first electrode terminal 411 on a plane where the bridging connection layer 211 is located is within the coverage range of the bridge electrode terminal 311, a certain is caused to exist between the first electrode terminal 411 and the residual metal 34 formed at the edge of the bridge electrode terminal 311, so that the first electrode terminal 411 is insulated from the residual metal 34, and thereby preventing short-circuiting between the first touch electrode 32 where the first electrode terminal 411 is located and the second touch electrode; This ensures proper operation of the touch effect of the display panel.

With continued reference to FIG. 8, in an embodiment, in the first direction X, the extension length of the first electrode terminal 411 is D1, and the extension length of the bridge electrode terminal 311 is D2, where D1<D2. In the second direction Y, the first extension length of the electrode terminal 411 is D3, and the extension length of the bridge electrode terminal 311 is D4, where D3<D4. Moreover, a vertical projection of the first electrode terminal 411 on a plane where the bridging connection layer 211 is located does not overlap with the edge of the bridge electrode terminal 311.

As shown in FIGS. 8 and 9, with the setting in which the size of the bridge electrode terminal 311 is larger than the size of the first electrode terminal 411, and the vertical projection of the first electrode terminal 411 on the plane where the bridging connection layer 211 is located does not overlap with the edge of the bridge electrode terminal 311, the distance between the first electrode terminal 411 and the residual metal 34 formed at the edge of the bridge electrode terminal 311 is further increased to ensure the insulation effect between the first electrode terminal 411 and the residual metal 34 formed at the edge of the bridge electrode terminal 311.

In an embodiment, the center of the vertical projection of the first electrode terminal 411 on the plane where the bridging connection layer 211 is located overlaps with the center of the bridge electrode terminal 311.

Referring to 8 and 9, the first electrode terminal 411 is center-aligned with the bridge electrode terminal 311, then each edge of the first electrode terminal 411 has a certain distance from the residual metal 34 at the edge of the bridge electrode terminal 311, so that an insulating effect between the first electrode terminal 411 and the residual metal 34 at the edge of the bridge electrode terminal 311 is ensured.

In an embodiment, $1\ nm \leq D2-D1 \leq 2\ nm$, $1\ nm \leq D4-D3 \leq 2\ nm$.

If the size difference between the bridge electrode terminal 311 and the first electrode terminal 411 is too small, the insulation effect between the first electrode terminal 411 and the residual metal 34 at the edge of the bridge electrode terminal 311 cannot be ensured; if the size difference between the bridge electrode terminal 311 and the first electrode terminal 411 is too large, the area of the bridge electrode terminal 311 will be larger, which will affect the capacitance between the first touch electrode 32 and the second touch electrode 33, and thus affect the touch effect. In the embodiment of the present disclosure, with the setting in which D2–D1 and D4–D3 have appropriate values, the influence of the bridge electrode terminal 311 on the touch effect is reduced while ensuring the insulation effect between the first electrode terminal 411 and the residual metal 34 at the edge of the bridge electrode terminal 311.

With continued reference to FIG. 8, in an embodiment, in the second direction Y, the extension length of the bridge electrode terminal 311 is greater than the width of the bridge trace 312, and a first corner 51 is formed at the connection between the bridge electrode terminal 311 and the bridge trace 312.

As shown in FIG. 8, in the second direction Y, since the extension length of the bridge electrode terminal 311 is greater than the width of the bridge trace 312, the first corner 51 is formed at the connection between the bridge electrode terminal 311 and the bridge trace 312. On one hand, the metal is not likely to remain at the first corner 51, so the residual metal 34 will be disconnected at the first corner 51, and thereby the probability of short-circuiting between the first touch electrode 32 and the second touch electrode 33 is further reduced; on the other hand, as shown in FIG. 8, point a is the electrical connection point of the residual metal 34 and the second touch electrode 33, and point b is the electrical connection point of the residual metal 34 and the first touch electrode 32. Given that the extension length of the bridge electrode terminal 311 is greater than the width of the bridge trace 312, the path distance of the residual metal 34 from point a to point b is increased, thereby substantially increasing the isolation of residual metal 34.

With continued reference to FIG. 8, in an embodiment, the bridge electrode terminal 311 includes at least one second corner 52.

In the exemplary embodiment shown in FIG. 8, the bridge electrode terminal 311 has a quadrangular shape, and therefore includes four second corners 52. At the second corner 52, the metal is not likely to remain, so the residual metal 34 will be disconnected at the second corner 52, and thereby the probability of short-circuiting between the first touch electrode 32 and the second touch electrode 33 is further reduced.

Figure 10:
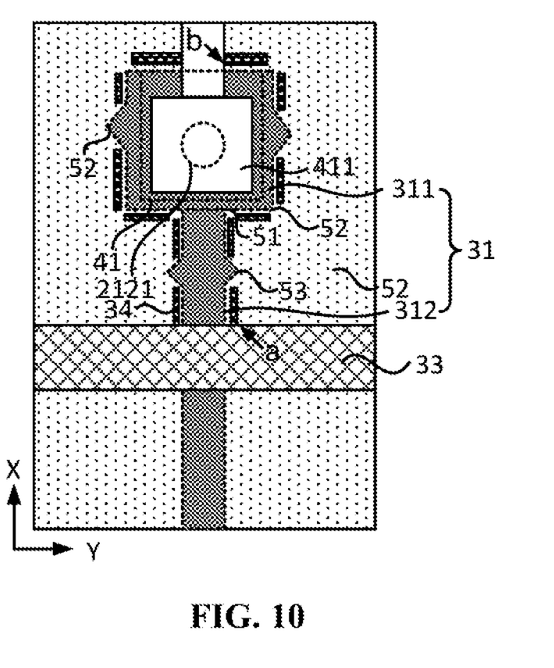
FIG. 10 is a schematic structure diagram of a bridge electrode terminal according to an embodiment of the present disclosure.

FIG. 10 is a top schematic diagram of a bridge electrode terminal according to an embodiment of the present disclosure. In the exemplary embodiment shown in FIG. 10, a protruding structure is provided on the bridge electrode terminal 311. The protruding structure is a triangle to form a second corner 52, and the metal is not likely to remain at the second corner 52, so the residual metal 34 will be disconnected at the second corner 52, and thereby the probability of short-circuiting between the first touch electrode 32 and the second touch electrode 33 is further reduced. In addition, the protruding structure provided on the bridge electrode terminal 311 also increases the path distance of the residual metal 34 from point a to point b, and thus increases the probability of the residual metal 34 being disconnected. The second corner 52 may be one or more of an obtuse angle, a right angle, and an acute angle, which is not limited in the embodiment of the present disclosure.

Figure 11:
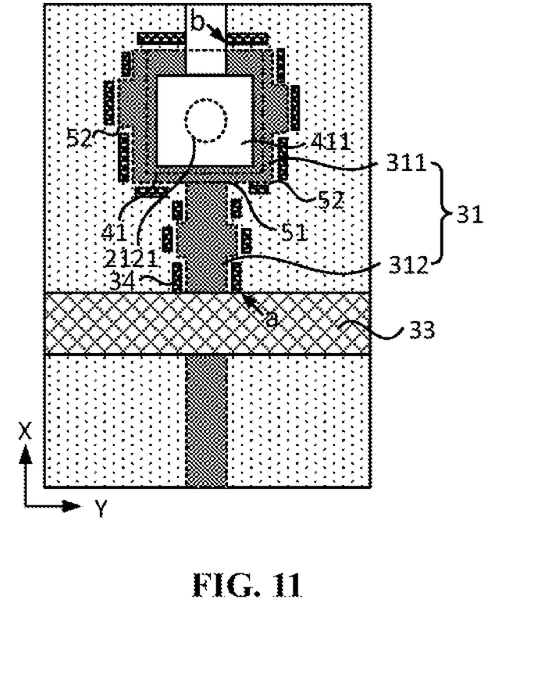
FIG. 11 is a schematic structure diagram of another bridge electrode terminal according to an embodiment of the present disclosure.

FIG. 11 is a top schematic diagram of another bridge electrode terminal according to an embodiment of the present disclosure. In the embodiment shown in FIG. 11, the protruding structure provided on the bridge electrode terminal 311 is rectangular, thereby multiple second corners 52 are formed. The metal is not likely to remain at the second corners 52, so the residual metal 34 will be disconnected at the second corners 52, and thereby the probability of short-circuiting between the first touch electrode 32 and the second touch electrode 33 is further reduced. It is understood that the protruding structure is not limited to triangle and rectangle as shown in FIG. 10 and FIG. 11, and may have any other shape.

Figure 12:
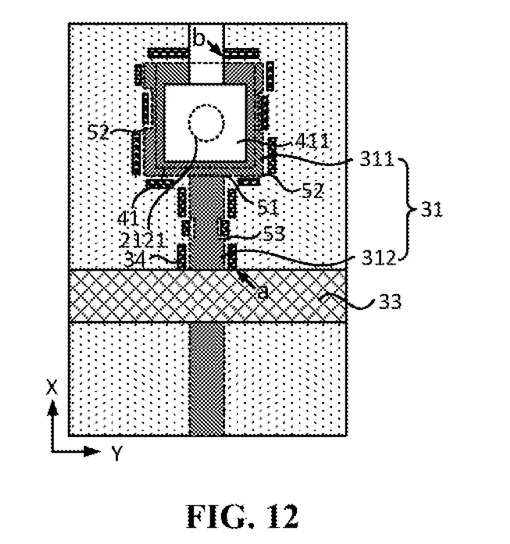
FIG. 12 is a schematic structure diagram of yet another bridge electrode terminal according to an embodiment of the present disclosure.

FIG. 12 is a top schematic diagram of yet another bridge electrode terminal according to an embodiment of the present disclosure. In the embodiment shown in FIG. 12, a recessed structure may also be provided on the bridge electrode terminal 311 to form a second corner 52. The metal is not likely to remain at the second corner 52, so the residual metal 34 will be disconnected at the second corner 52, and thereby the probability of short-circuiting between the first touch electrode 32 and the second touch electrode 33 is further reduced. In addition, the recessed structure provided on the bridge electrode terminal 311 also increases the path distance of the residual metal 34 from point a to point b, and therefore increases the probability of the residual metal 34 being disconnected. The shape of the recessed structure may be a rectangle as shown in FIG. 12, or any other shape such as a triangle.

It is understood that the number of second corners 52 may be determined by the number of protruding structures or recessed structures provided on the bridge electrode terminal 311. The greater the number of second corners 52 is, the smaller the probability of short-circuiting between the first touch electrodes 32 and the second touch electrodes 33 is; but the complexity of the bridge electrode terminal 311 is also increased.

In an embodiment, the bridge trace 312 includes at least one third corner 53.

With continued reference to FIG. 10, a protruding structure is provided on the bridge trace 312. The protruding structure is shown as a triangle, and thereby a third corner 53 is formed. The metal is not likely to remain at the third corner 53, so the residual metal 34 will be disconnected at the third corner 53, and the probability of short-circuiting between the first touch electrode 32 and the second touch electrode 33 is further reduced. In addition, the protruding structure provided on the bridge trace 312 also increases the path distance of the residual metal 34 from point a to point b, and therefore increases the probability of the residual metal 34 being disconnected. The third corner 53 may be one or more of an obtuse angle, a right angle, and an acute angle, which is not limited in the embodiment of the present disclosure.

In another embodiment, with continued reference to FIG. 11, the protruding structure provided on the bridge trace 312 is rectangular, and thereby multiple third corners 53 are formed. The metal is not likely to remain at the third corners 53, so the residual metal 34 will be disconnected at the third corners 53, and the probability of short-circuiting between the first touch electrode 32 and the second touch electrode 33 is further reduced. It should be noted that the protruding structure is not limited to triangle and rectangle as shown in FIG. 10 and FIG. 11, but may also be any other shape. Those skilled in the art may set the protruding structure according to actual needs, as long as the third corner 53 can be formed.

In another embodiment, with continued reference to FIG. 12, a recessed structure may also be provided on the bridge trace 312 to form a third corner 53. The metal is not likely to remain at the third corner 53, so the residual metal 34 will be disconnected at the third corner 53, and the probability of short-circuiting between the first touch electrode 32 and the second touch electrode 33 is further reduced. In addition, the recessed structure provided on the bridge trace 312 also increases the path distance of the residual metal 34 from point a to point b, and therefore the probability of the residual metal 34 being disconnected. The shape of the recessed structure may be rectangle as shown in FIG. 12, or any other shape such as a triangle.

It is understood that the number of third corners 53 may be determined by the number of protruding structures or recessed structures provided on the bridge trace 312. The greater the number of third corners 53 is, the smaller the probability of short-circuiting between the first touch electrodes 32 and the second touch electrodes 33 is; but the complexity of the bridge trace 312 is also increased.

Figure 13:
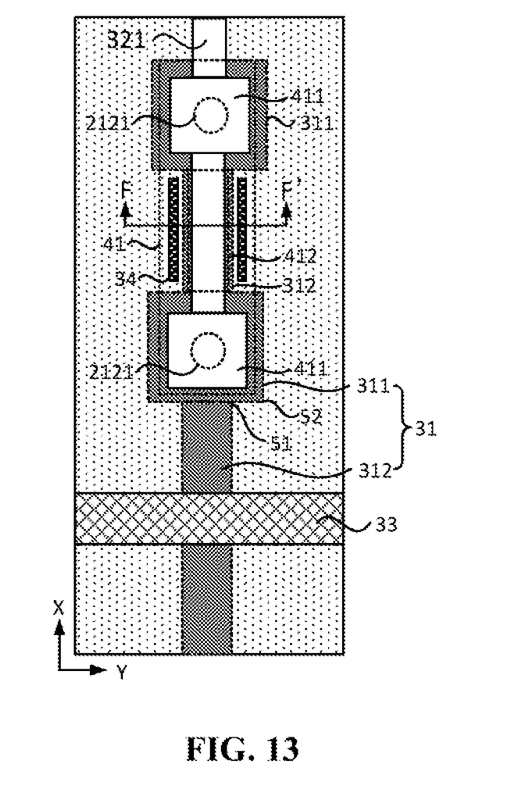
FIG. 13 is a schematic structural diagram of yet another display panel according to an embodiment of the present disclosure.
Figure 14:
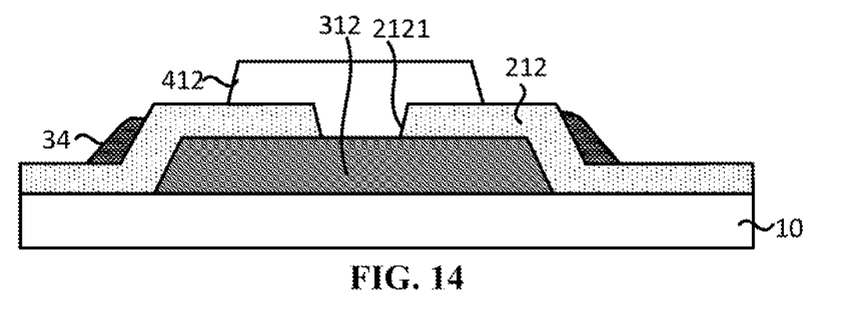
FIG. 14 is a schematic cross-sectional view of FIG. 13 taken along an F-F' direction.

FIG. 13 is a top schematic diagram of a display panel according to another embodiment of the present disclosure; FIG. 14 is a cross-sectional schematic diagram of FIG. 13 along the F-F' direction. As shown in FIGS. 13 and 14, the bridge trace 312 extends in the first direction X; the first electrode subsection 41 further includes a first electrode trace 412; the first electrode trace 412 extends in the first direction X; a vertical projection of the first electrode trace 412 on the plane where the bridging connection layer 211 is located is within the coverage of the bridge trace 312.

As shown in FIGS. 13 and 14, in order to reduce the connection resistance between the first electrode subsection 41 and the bridge electrode 31, each first electrode unit 321 is electrically connected to the bridge electrode 31 through multiple vias 2121. Therefore, the first electrode subsection 41 includes the first electrode trace 412 overlapping the bridge trace 312. In the display panel provided by the embodiment of the present disclosure, with the setting in which a vertical projection of the first electrode trace 412 on a plane where the bridging connection layer 211 is located is within the coverage range of the bridge trace 312, a certain gap exists between the first electrode trace 412 and the residual metal 34 formed at the edge of the bridge trace 312, so that the first electrode subsection 41 is insulated from the residual metal 34, and thereby short-circuiting between the first touch electrode 32 where the first electrode subsection 41 is located and the second touch electrode 33 is avoided, and the touch effect of the display panel is ensured.

With continued reference to FIG. 13 and FIG. 14, in the second direction Y, the width of the bridge trace 312 is greater than the width of the first electrode trace 412, and a vertical projection of the first electrode trace 412 on the plane where the bridging connection layer 211 is located does not overlap the edge of the bridge trace 312.

As shown in FIG. 13 and FIG. 14, with the setting in which the width of the bridge trace 312 is greater than the width of the first electrode trace 412, and the vertical projection of the first electrode trace 412 on the plane where the bridging connection layer 211 is located does not overlap with the edge of the bridge trace 312, the distance between the first electrode trace 412 and the residual metal 34 formed at the edge of the bridge trace 312 is further increased to ensure insulation between the first electrode trace 412 and the residual metal 34 formed at the edge of the bridge trace 312.

Figure 15:
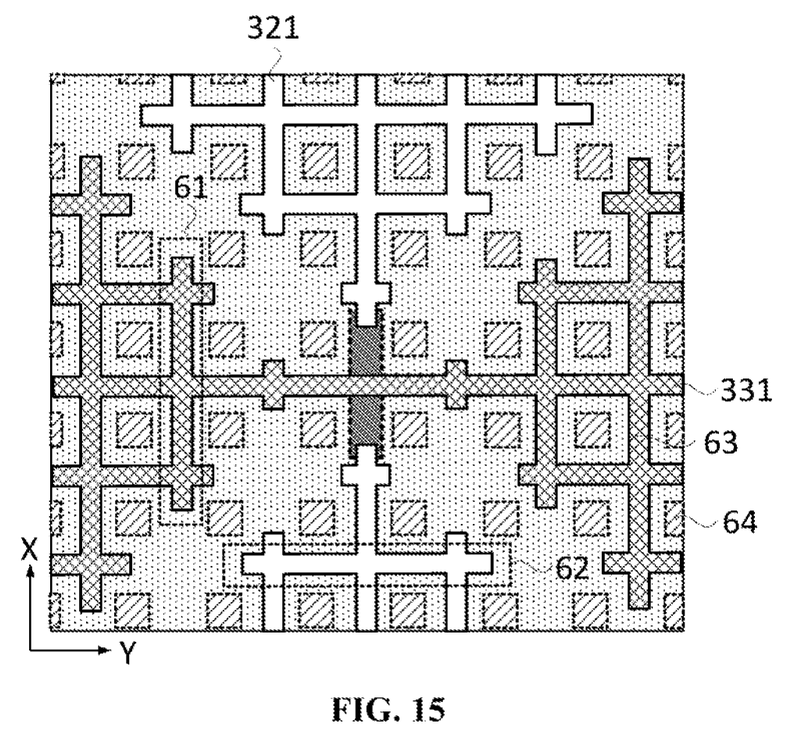
FIG. 15 is a schematic structural diagram of yet another display panel according to an embodiment of the present disclosure.

FIG. 15 is a top schematic diagram of a display panel according to another embodiment of the present disclosure. As shown in FIG. 15, the first electrode unit 321 and the second electrode unit 331 both have grid structures, and the grid structure includes multiple first traces 61 extending in the first direction X and multiple second traces 62 extending in the second direction Y. Two adjacent first traces 61 and two adjacent second traces 62 cross to define a mesh 63 of the grid structure. The display function layer 20 includes multiple sub-pixels 64. A vertical projection of the mesh 63 on the plane where the display function layer 20 is located covers at least one sub-pixel 64.

The first electrode unit 321 and the second electrode unit 331 are both made of metal. The metal has good conductivity, but poor light transmittance. With the setting in which each of the first electrode unit 321 and the second electrode unit 331 has a grid structure, the grid structure includes first traces 61, second traces 62, and meshes 63 each defined by the intersection of two adjacent first traces 61 and two adjacent second traces 62. A vertical projection of the mesh 63 on the plane where the display function layer 20 is located covers at least one sub-pixel 64, so that the first trace 61 and the second trace 62 do not overlap the sub-pixel 64 to avoid affecting the light-emitting effect of sub-pixel 64.

Figure 16:
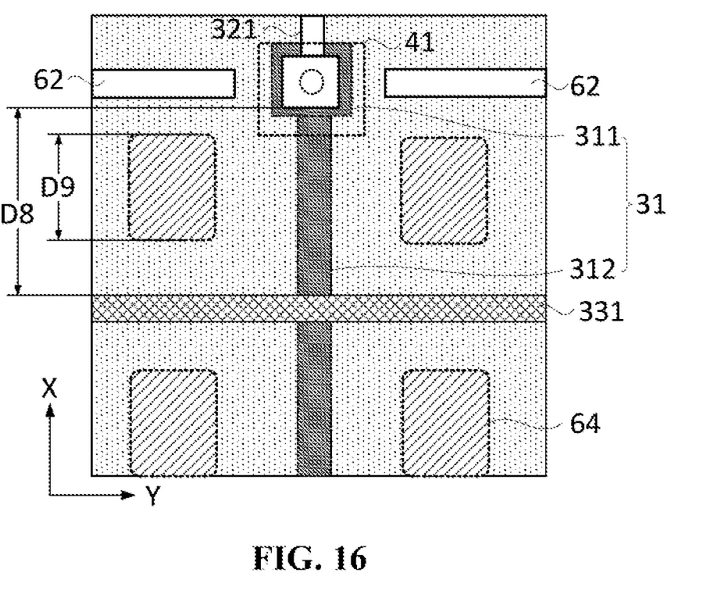
FIG. 16 is a schematic structural diagram of yet another display panel according to an embodiment of the present disclosure.

FIG. 16 is a top schematic diagram of a display panel according to another embodiment of the present disclosure. As shown in FIG. 16, in a same first electrode unit 321, the second trace 62 is not connected to the first electrode subsection 41, and a vertical projection of the second trace 62 on the plane where the bridging connecting layer 211 is located does not overlap the edge of the bridge electrode 31.

With the setting in which the second trace 62 is disconnected from the first electrode branch 41, and the vertical projection of the second trace 62 on the plane where the bridging connecting layer 211 is located not overlapping the edge of the bridge electrode 31, the second trace 62 of the first electrode unit 321 is insulated from the residual metal 34 formed at the edge of the bridge electrode 31, so as to avoid short-circuiting between the first touch electrode 32 and the second touch electrode 33, and ensure proper operation of the touch effect of the display panel.

With continued reference to FIG. 16, the display function layer 20 includes multiple sub-pixels 64. In the first direction X, the shortest distance between the first electrode unit 321 and the second electrode unit 331 is D8, and the length of the sub-pixel 64 is D9, where D8>D9.

In the first direction X, since it is ensured that the shortest distance between the first electrode unit 321 and the second electrode unit 331 is greater than the length of the sub-pixel 64, a large distance exists between the first electrode unit 321 and the second electrode unit 331, which helps to increase the probability of disconnection between parts of the residual metal 34 and ensure the insulation between the first electrode unit 321 and the second electrode unit 331.

Figure 17:
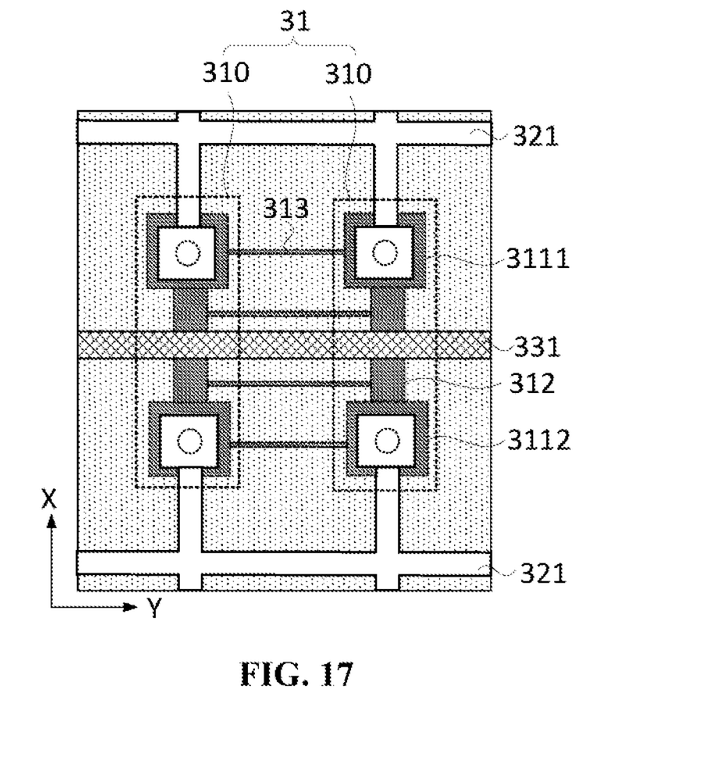
FIG. 17 is a schematic structural diagram of yet another display panel according to an embodiment of the present disclosure.

FIG. 17 is a top schematic diagram of a display panel according to another embodiment of the present disclosure. As shown in FIG. 17, the bridge electrode 31 includes at least two sub-bridge electrodes 310, and the sub-bridge electrode 310 include a first bridge electrode terminals 3111, a second bridge electrode terminal 3112 and a bridge trace 312 connecting the first bridge electrode terminal 3111 and the second bridge electrode terminal 3112; the first bridge electrode terminal 3111 and the second bridge electrode terminal 3112 are respectively punched and electrically connected to two adjacent first electrode units 321, and the bridge trace 312 extends in the first direction X.

Since the bridge electrode 31 is set to include at least two sub-bridge electrodes 310, the two adjacent first electrode units 321 are electrically connected through multiple sub-bridge electrodes 310, which helps to reduce the resistance of the bridge electrode 31 and reduce the loss of the touch signal on the bridge electrode 31. In other embodiments, the number of sub-bridge electrodes 310 may be set according to actual needs.

It should be noted that each sub-bridge electrode 310 may include multiple first bridge electrode terminals 3111 and multiple second bridge electrode terminals 3112, and each first electrode unit 321 may be electrically connected to the sub-bridge electrode 310 through multiple first bridge electrode terminals 3111 and multiple second bridge electrode terminals 3112, and thereby the gap between the first electrode unit 321 and thereby the connection resistance between the first electrode unit 321 and the sub-bridge electrode 310 is further reduced.

With continued reference to FIG. 17, the bridge electrode 31 further includes at least one connection trace 313 extending in the second direction Y, and the adjacent two sets of sub-bridge electrodes 310 are electrically connected through the connection trace 313.

Since the bridge electrode 31 is set to include at least one connecting trace 313 extending in the second direction Y, the bridge electrode 31 has both traces extending in the first direction X and traces extending in the second direction Y, which makes the distribution of traces more uniform, thereby obvious boundary of the bridge electrode 31, which affects the display effect, is avoided. In other embodiments, the number of connecting traces 313 may be set according to actual needs.

In an embodiment, the first touch electrode 32 is a touch driving electrode, the second touch electrode 33 is a touch sensing electrode, or the first touch electrode 32 is a touch sensing electrode, and the second touch electrode 33 is a touch driving electrode.

The touch driving electrode and the touch sensing electrode are both electrically connected to the driving chip. During the touch stage, the driving chip sends a touch driving signal to the touch driving electrode; when a touch of a touching body is sensed by the touch sensing electrode, the touch sensing electrode sends a touch sensing signal to the driving chip, and the driving chip determines the touch position according to the touch sensing signal, thereby realizing the touch function of the display panel.

Figure 18:
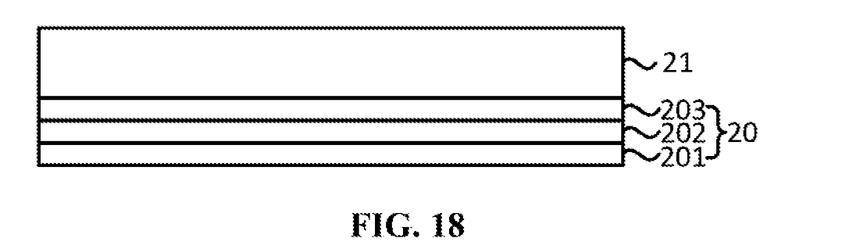
FIG. 18 is a schematic structural diagram of yet another display panel according to an embodiment of the present disclosure.

FIG. 18 is a highly simplified cross-sectional schematic diagram of a display panel according to an embodiment of the present disclosure. As shown in FIG. 18, the display panel provided by the embodiment of the present disclosure is an organic light-emitting display panel, and the display function layer 20 includes a pixel circuit layer 201, an organic light-emitting layer 202, and an packaging layer 203 disposed in turn, and the touch function layer 21 is located on one side of the packaging layer 203 facing away from the organic light-emitting layer 202.

The organic light-emitting display panel includes an organic light-emitting layer 202, the organic light-emitting layer 202 is self-luminous, each pixel emitting light of three primary colors, i.e., red, green and blue. This makes the display effect of the organic light-emitting display panel more vivid and full. Since the pixels of the organic light-emitting display panel work independently, the power consumption is low, and the response speed is fast, and the organic light-emitting display panel does not need to be provided with a backlight layer, these features help to realize curved screens.

Figure 19:
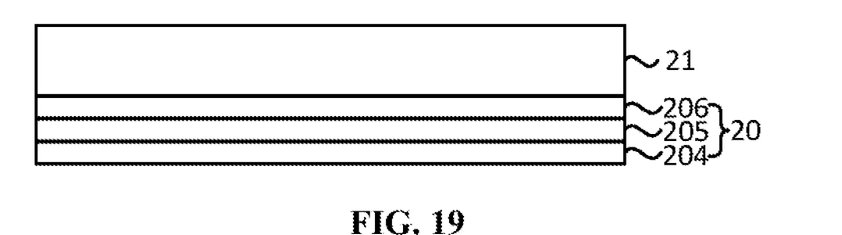
FIG. 19 is a schematic structural diagram of yet another display panel according to an embodiment of the present disclosure.

FIG. 19 is a highly simplified cross-sectional schematic diagram of a display panel according to an embodiment of the present disclosure. As shown in FIG. 19, the display panel provided is a liquid crystal display panel, and the display function layer 20 includes an array substrate 204, a liquid crystal layer 205 and a color filter substrate 206 disposed in turn. The touch function layer 21 is located on one side of the color filter substrate 206 facing away from the liquid crystal layer 205.

The liquid crystal display panel includes a liquid crystal layer 205, which is disposed on a light extraction surface of the backlight. An array substrate 204 controls the deflection of the liquid crystals in the liquid crystal layer 205 to control the brightness of the pixels, and then controls the display pattern of the liquid crystal display panel. The display effect of the liquid crystal display panel is relatively natural, people are unlikely to fatigue after long-term viewing, and the liquid crystal display panel is low cost and long life.

In the display panel provided by the embodiment of the present disclosure, by setting specific size, structure, and positional relationship between the first electrode subsection 41 of the first electrode unit 321 in the first touch electrode 32 and the bridge electrode 31, and ensuring a large distance between the first electrode unit 321 and the second electrode unit 331, the probability of disconnection between parts of the residual metal 34 is increased, the probability of short-circuiting between the first electrode unit 321 and the second electrode unit 331 is greatly reduced, and the touch effect of the display panel is ensured.

Figure 20:
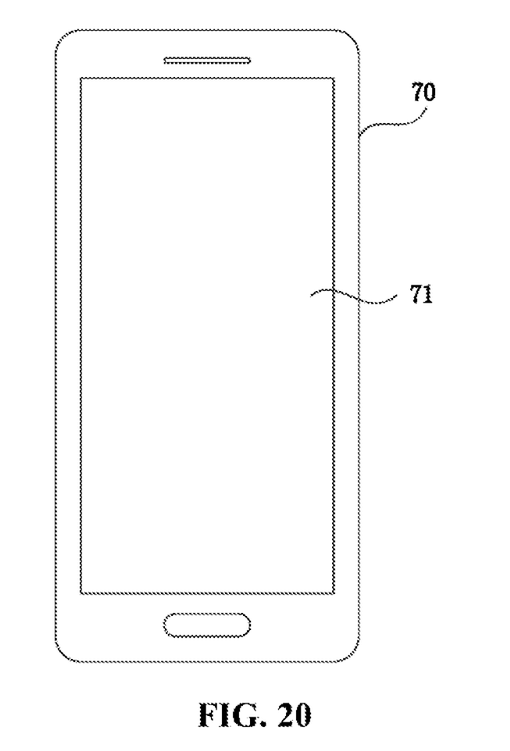
FIG. 20 is a schematic structure diagram of a display device according to an embodiment of the present disclosure.

Based on the same inventive concept, an embodiment of the present disclosure also provides a display device. FIG. 20 is a schematic view of a display device according to an embodiment of the present disclosure. As shown in FIG. 20, the display device 70 includes the display panel 71 described in any embodiment of the present disclosure. Therefore, the display device 70 provided by the embodiment of the present disclosure has the technical effects in any of the above embodiments, and explanation of the same or corresponding structures and terms as those in the above embodiments will not be repeated here. The display device 70 provided by the embodiment of the present disclosure may be the mobile phone shown in FIG. 20, or any electronic product with a display function, including but not limited to the following categories: TV, notebook computer, desktop display, tablet computer, digital cameras, smart bracelets, smart glasses, on-board displays, medical equipment, industrial control equipment, touch interactive terminals, etc., which are not particularly limited in the embodiments of the present disclosure.

It is understood that the above are merely some embodiments of the present disclosure and the technical principles used therein. It will be understood by those skilled in the art that the present disclosure is not limited to the specific embodiments described herein. Those skilled in the art may make various apparent modifications, adaptations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A display panel, comprising a display function layer and a touch function layer;
    wherein the touch function layer comprises a bridging connection layer, an insulating layer and a touch electrode layer disposed on a light extraction side of the display function layer;
    wherein the bridging connection layer comprises a plurality of bridge electrodes;

wherein the touch electrode layer comprises a plurality of first touch electrodes and a plurality of second touch electrodes, wherein the plurality of first touch electrodes and the plurality of second touch electrodes are insulated from each other; wherein each of the plurality of first touch electrodes comprises a plurality of first electrode units electrically connected to each other, wherein the plurality of first electrode units are arranged in a first direction; wherein each of the plurality of second touch electrodes comprises a plurality of second electrode units electrically connected to each other, wherein the plurality of second electrode units are arranged in a second direction; wherein the first direction and the second direction intersect; and wherein in each of the plurality of first touch electrodes, any two adjacent first electrode units are electrically connected through one of the plurality of bridge electrodes;

wherein each of the plurality of first electrode units comprises a first electrode subsection, and wherein a vertical projection of the first electrode subsection on a plane where the bridging connection layer is located is within a coverage of one of the plurality of bridge electrodes;

wherein each of the plurality of bridge electrodes comprises a bridge electrode terminal and a bridge trace electrically connected to the bridge electrode terminal;

wherein the first electrode subsection comprises a first electrode terminal, wherein the insulating layer is provided with a plurality of vias, and wherein the first electrode terminal is electrically connected to the bridge electrode terminal through one of the plurality of vias;

wherein a vertical projection of the first electrode terminal on a plane where the bridging connection layer is located is within a coverage of the bridge electrode terminal; and wherein the second direction, an extension length of the bridge electrode terminal is greater than a width of the bridge trace, and a first corner is formed at a joint of the bridge electrode terminal and the bridge trace.

2. The display panel of claim 1, wherein in the first direction, an extension length of the first electrode terminal is defined by D1, and an extension length of the bridge electrode terminal is defined by D2, wherein D1<D2; wherein in the second direction, the extension length of the first electrode terminal is defined by D3, and the extension length of the bridge electrode terminal is defined by D4, wherein D3<D4; and wherein a vertical projection of the first electrode terminal on a plane where the bridging connection layer is located does not overlap with an edge of the bridge electrode terminal.

3. The display panel of claim 2, wherein a center of the vertical projection of the first electrode terminal on the plane where the bridging connection layer is located overlaps with a center of the bridge electrode terminal.

4. The display panel of claim 2, wherein 1 nm≤D2−D1≤2 nm; 1 nm≤D4−D3≤2 nm.

5. The display panel of claim 1, wherein the bridge electrode terminal comprises at least one second corner.

6. The display panel of claim 1, wherein the bridge trace comprises at least one third corner.

7. The display panel of claim 1, wherein the bridge trace extends in the first direction; and wherein the first electrode subsection further comprises a first electrode trace, the first electrode trace extending in the first direction, and wherein a vertical projection of the first electrode trace on a plane where the bridging connection layer is located is within a coverage of the bridge trace.

8. The display panel of claim 7, wherein in the second direction, a width of the bridge trace is greater than a width of the first electrode trace, and a vertical projection of the first electrode trace on the plane where the bridging connection layer is located does not overlap with an edge of the bridge trace.

9. The display panel of claim 1, wherein each of the plurality of first electrode units and the plurality of second electrode units has a grid structure, and wherein the grid structure comprises a plurality of first traces extending in the first direction and a plurality of second traces extending in the second direction, and wherein two adjacent traces of the plurality of first traces and two adjacent traces of the plurality of second traces cross to define a mesh of the grid structure;

wherein the display function layer comprises a plurality of sub-pixels; and wherein a vertical projection of the mesh on a plane where the display function layer is located covers at least one of the plurality of sub-pixels.

10. The display panel of claim 9, wherein in one of the plurality of first electrode units, one of the plurality of second traces is not connected to the first electrode subsection, and wherein a vertical projection of one of the plurality of second traces on a plane where the bridging connection layer is located does not overlap with an edge of one of the plurality of bridge electrodes.

11. The display panel of claim 1, wherein the display function layer comprises a plurality of sub-pixels; and wherein in the first direction, a shortest distance between one of the plurality of first electrode units and one of the plurality of second electrode units is defined by D8, and wherein a length of each of the plurality of sub-pixels is defined by D9, wherein D8>D9.

12. The display panel of claim 1, wherein each of the plurality of bridge electrodes comprises at least two sub-bridge electrodes, wherein each of the at least two sub-bridge electrodes comprises a first bridge electrode terminal, a second bridge electrode terminal, and a bridge trace connected between the first bridge electrode terminal and the second bridge electrode terminal; and wherein the first bridge electrode terminal and the second bridge electrode terminal are respectively electrically connected to two adjacent first electrode units of the plurality of first electrode units through perforation, and wherein the bridge trace extends in the first direction.

13. The display panel of claim 12, wherein each of the plurality of bridge electrodes further comprises at least one connecting trace extending in the second direction, and two adjacent groups of sub-bridge electrodes of the at least two groups of sub-bridge electrodes are electrically connected through the at least one connecting trace.

14. The display panel of claim 1, wherein each of the plurality of first touch electrodes is a touch driving electrode or a touch sensing electrode, and each of the plurality of second touch electrodes is a touch sensing electrode or a touch driving electrode.

15. The display panel of claim 1, wherein the display panel is an organic light-emitting display panel; and wherein the display function layer comprises a pixel circuit layer, an organic light-emitting layer and a packaging layer; and wherein the touch function layer is located on a side of the packaging layer facing away from the organic light-emitting layer.

16. The display panel of claim 1, wherein the display panel is a liquid crystal display panel; and
    wherein the display function layer comprises an array substrate, a liquid crystal layer and a color film substrate; and wherein the touch function layer is located on a side of the color film substrate facing away from the liquid crystal layer.

17. A display apparatus, comprising a display panel,
    wherein the display panel comprises a display function layer and a touch function layer;
    wherein the touch function layer comprises a bridging connection layer, an insulating layer and a touch electrode layer disposed on a light extraction side of the display function layer;
    wherein the bridging connection layer comprises a plurality of bridge electrodes;
    wherein the touch electrode layer comprises a plurality of first touch electrodes and a plurality of second touch electrodes, wherein the plurality of first touch electrodes and the plurality of second touch electrodes are insulated from each other; wherein each of the plurality of first touch electrodes comprises a plurality of first electrode units electrically connected to each other, wherein the plurality of first electrode units are arranged in a first direction; wherein each of the plurality of second touch electrodes comprises a plurality of second electrode units electrically connected to each other, wherein the plurality of second electrode units are arranged in a second direction; wherein the first direction and the second direction intersect; and wherein in each of the plurality of first touch electrodes, any two adjacent first electrode units are electrically connected through one of the plurality of bridge electrodes; and
    wherein each of the plurality of first electrode units comprises a first electrode subsection, and wherein a vertical projection of the first electrode subsection on a plane where the bridging connection layer is located is within a coverage of one of the plurality of bridge electrodes;
    wherein each of the plurality of bridge electrodes comprises a bridge electrode terminal and a bridge trace electrically connected to the bridge electrode terminal;
    wherein the first electrode subsection comprises a first electrode terminal, wherein the insulating layer is provided with a plurality of vias, and wherein the first electrode terminal is electrically connected to the bridge electrode terminal through one of the plurality of vias,
    wherein a vertical projection of the first electrode terminal on a plane where the bridging connection layer is located is within a coverage of the bridge electrode terminal; and
    wherein the second direction, an extension length of the bridge electrode terminal is greater than a width of the bridge trace, and a first corner is formed at a joint of the bridge electrode terminal and the bridge trace.

18. A display panel, comprising a display function layer and a touch function layer;
    wherein the touch function layer comprises a bridging connection layer, an insulating layer and a touch electrode layer disposed on a light extraction side of the display function layer;
    wherein the bridging connection layer comprises a plurality of bridge electrodes;
    wherein the touch electrode layer comprises a plurality of first touch electrodes and a plurality of second touch electrodes, wherein the plurality of first touch electrodes and the plurality of second touch electrodes are insulated from each other; wherein each of the plurality of first touch electrodes comprises a plurality of first electrode units electrically connected to each other, wherein the plurality of first electrode units are arranged in a first direction; wherein each of the plurality of second touch electrodes comprises a plurality of second electrode units electrically connected to each other, wherein the plurality of second electrode units are arranged in a second direction; wherein the first direction and the second direction intersect; and wherein in each of the plurality of first touch electrodes, any two adjacent first electrode units are electrically connected through one of the plurality of bridge electrodes;
    wherein each of the plurality of first electrode units comprises a first electrode subsection, and wherein a vertical projection of the first electrode subsection on a plane where the bridging connection layer is located is within a coverage of one of the plurality of bridge electrodes;
    wherein each of the plurality of bridge electrodes comprises a bridge electrode terminal and a bridge trace electrically connected to the bridge electrode terminal;
    wherein the first electrode subsection comprises a first electrode terminal, wherein the insulating layer is provided with a plurality of vias, and wherein the first electrode terminal is electrically connected to the bridge electrode terminal through one of the plurality of vias;
    wherein a vertical projection of the first electrode terminal on a plane where the bridging connection layer is located is within a coverage of the bridge electrode terminal; and
    wherein the bridge trace comprises at least one corner.

19. A display panel, comprising a display function layer and a touch function layer;
    wherein the touch function layer comprises a bridging connection layer, an insulating layer and a touch electrode layer disposed on a light extraction side of the display function layer;
    wherein the bridging connection layer comprises a plurality of bridge electrodes;
    wherein the touch electrode layer comprises a plurality of first touch electrodes and a plurality of second touch electrodes, wherein the plurality of first touch electrodes and the plurality of second touch electrodes are insulated from each other; wherein each of the plurality of first touch electrodes comprises a plurality of first electrode units electrically connected to each other, wherein the plurality of first electrode units are arranged in a first direction; wherein each of the plurality of second touch electrodes comprises a plurality of second electrode units electrically connected to each other, wherein the plurality of second electrode units are arranged in a second direction; wherein the first direction and the second direction intersect; and wherein in each of the plurality of first touch electrodes, any two adjacent first electrode units are electrically connected through one of the plurality of bridge electrodes;
    wherein each of the plurality of first electrode units comprises a first electrode subsection, and wherein a vertical projection of the first electrode subsection on a plane where the bridging connection layer is located is within a coverage of one of the plurality of bridge electrodes;

wherein each of the plurality of bridge electrodes comprises a bridge electrode terminal and a bridge trace electrically connected to the bridge electrode terminal;

wherein the first electrode subsection comprises a first electrode terminal, wherein the insulating layer is provided with a plurality of vias, and wherein the first electrode terminal is electrically connected to the bridge electrode terminal through one of the plurality of vias;

wherein a vertical projection of the first electrode terminal on a plane where the bridging connection layer is located is within a coverage of the bridge electrode terminal;

wherein each of the plurality of first electrode units and the plurality of second electrode units has a grid structure, and wherein the grid structure comprises a plurality of first traces extending in the first direction and a plurality of second traces extending in the second direction, and wherein two adjacent traces of the plurality of first traces and two adjacent traces of the plurality of second traces cross to define a mesh of the grid structure;

wherein the display function layer comprises a plurality of sub-pixels;

wherein a vertical projection of the mesh on a plane where the display function layer is located covers at least one of the plurality of sub-pixels; and wherein in one of the plurality of first electrode units, one of the plurality of second traces is not connected to the first electrode subsection, and wherein a vertical projection of one of the plurality of second traces on a plane where the bridging connection layer is located does not overlap with an edge of one of the plurality of bridge electrodes.

20. A display panel, comprising a display function layer and a touch function layer;

wherein the touch function layer comprises a bridging connection layer, an insulating layer and a touch electrode layer disposed on a light extraction side of the display function layer;

wherein the bridging connection layer comprises a plurality of bridge electrodes;

wherein the touch electrode layer comprises a plurality of first touch electrodes and a plurality of second touch electrodes, wherein the plurality of first touch electrodes and the plurality of second touch electrodes are insulated from each other; wherein each of the plurality of first touch electrodes comprises a plurality of first electrode units electrically connected to each other, wherein the plurality of first electrode units are arranged in a first direction; wherein each of the plurality of second touch electrodes comprises a plurality of second electrode units electrically connected to each other, wherein the plurality of second electrode units are arranged in a second direction; wherein the first direction and the second direction intersect; and wherein in each of the plurality of first touch electrodes, any two adjacent first electrode units are electrically connected through one of the plurality of bridge electrodes;

wherein each of the plurality of first electrode units comprises a first electrode subsection, and wherein a vertical projection of the first electrode subsection on a plane where the bridging connection layer is located is within a coverage of one of the plurality of bridge electrodes;

wherein each of the plurality of bridge electrodes comprises at least two sub-bridge electrodes, wherein each of the at least two sub-bridge electrodes comprises a first bridge electrode terminal, a second bridge electrode terminal, and a bridge trace connected between the first bridge electrode terminal and the second bridge electrode terminal;

wherein the first bridge electrode terminal and the second bridge electrode terminal are respectively electrically connected to two adjacent first electrode units of the plurality of first electrode units through perforation, and wherein the bridge trace extends in the first direction; and wherein each of the plurality of bridge electrodes further comprises at least one connecting trace extending in the second direction, and two adjacent groups of sub-bridge electrodes of the at least two groups of sub-bridge electrodes are electrically connected through the at least one connecting trace.

* * * * *